United States Patent
Meier et al.

[11] Patent Number: 5,854,567
[45] Date of Patent: Dec. 29, 1998

[54] LOW LOSS INTEGRATED CIRCUIT WITH REDUCED CLOCK SWING

[75] Inventors: Stefan Meier; Erik De Man, both of München, Germany

[73] Assignee: Siemens Aktiengesellschaft, Munich, Germany

[21] Appl. No.: 716,440

[22] PCT Filed: Mar. 10, 1995

[86] PCT No.: PCT/DE95/00335

§ 371 Date: Sep. 24, 1996

§ 102(e) Date: Sep. 24, 1996

[87] PCT Pub. No.: WO95/26077

PCT Pub. Date: Sep. 28, 1995

[30] Foreign Application Priority Data

Mar. 24, 1994 [DE] Germany ............................ 44 10 280.1

[51] Int. Cl.[6] ..................... H03K 17/687; H03K 19/096; H03K 19/094; G05F 1/10
[52] U.S. Cl. ............................. 327/437; 327/544; 326/95; 326/83
[58] Field of Search .................... 326/33, 83, 93, 326/95, 98, 121; 327/544, 437, 333, 328, 165

[56] References Cited

U.S. PATENT DOCUMENTS

| | | | |
|---|---|---|---|
| 5,198,699 | 3/1993 | Hashimoto et al. | 327/437 |
| 5,355,033 | 10/1994 | Jang | 326/33 |
| 5,436,585 | 7/1995 | DiMarco | 327/333 |
| 5,450,356 | 9/1995 | Miller | 326/121 |

FOREIGN PATENT DOCUMENTS

| | | | |
|---|---|---|---|
| 218288 A2 | 4/1987 | European Pat. Off. | 327/437 |
| 360096027 | 10/1983 | Japan | 326/121 |
| 361293015 | 6/1985 | Japan | 327/328 |

*Primary Examiner*—Michael J. Tokar
*Assistant Examiner*—Daniel D. Chang
*Attorney, Agent, or Firm*—Hill & Simpson

[57] ABSTRACT

The integrated circuit with a clock system, particularly a CMOS circuit with extensive pipelining, whereby an optimally low overall dissipated power is effected in that a clock driver circuit is provided with a specifically wired driver output stage that generates a clock supply voltage that corresponds to about half the value of a general supply voltage. A great reduction of the dissipated power can be achieved given relative slight sacrifices in the performance capability.

2 Claims, 2 Drawing Sheets

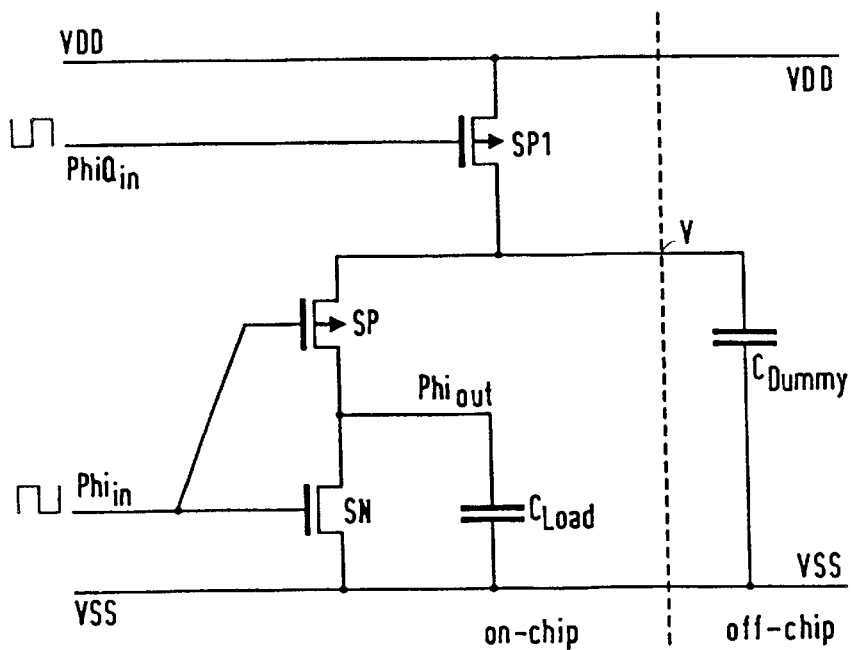
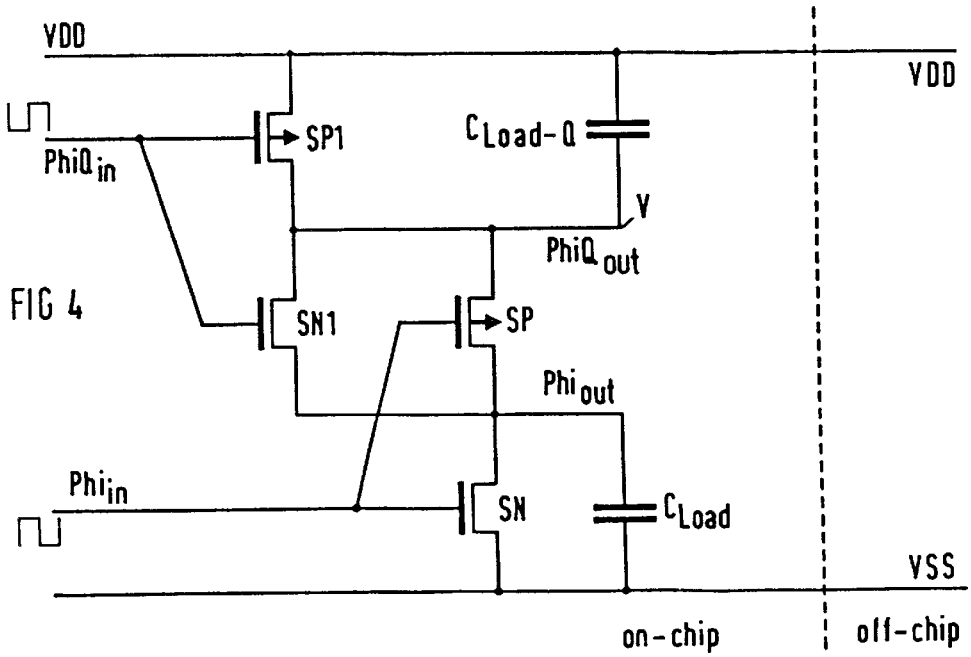

LOW LOSS INTEGRATED CIRCUIT WITH REDUCED CLOCK SWING

BACKGROUND OF THE INVENTION

1. Field of the Invention

The present invention relates generally to a clock circuit for an integrated circuit which reduces power consumption.

2. Description of the Related Art

The reduction of the dissipated power becomes more and more important due to the constantly increasing complexity of VLSI circuits, on the one hand, and the greater and greater employment of such components in battery-operated mobile devices and systems as well. Particularly in integrated CMOS circuits with many registers, a considerable part of the dissipated power devolves onto the recharging of the capacitance of the clock node or, in systems with distributed clocks, the clock nodes. Between 30 and 50 percent of the overall dissipated power thereby often arises in the clock system.

The overall capacitance of the clock node is composed of the gate capacitances of the transistors connected to the clock nodes and of the wiring capacitances of the clock lines. The two components cannot simply be arbitrarily reduced. Even increasingly smaller structures as a result of technological progress do not solve this problem since the lateral dimensions of a gate and of a line are in fact reduced, but the insulation layer also becomes thinner at the same time, and the smaller lateral dimensions are used for accommodating even more functions on a given chip area. Added thereto is that, given metal tracks with a width on the order of magnitude of 1 μm, the capacitance already dominates due to the edge capacitance and the coupling capacitance and is thus defined nearly only by the length of the line. A reduction of the track width leaves the edge capacitance nearly unmodified and does not significantly reduce the overall capacitance; a reduction of the interconnect spacing increases the coupling capacitance and, thus, the overall capacitance as well.

Given the fundamental assumption that the data throughput rate of the system should remain unaltered, a reduction of the switching frequency requires an increased complexity (parallelization), so that no saving of dissipated power can be achieved overall.

Another possibility of reducing the dissipated power is comprised in lowering the supply voltage of the overall circuit, whereby the supply voltage even enters quadratically into the dissipated power but requires a loss-affected matching to other circuit parts and potentially causes a reduction of the immunity to interference.

The publication PATENT ABSTRACT OF JAPAN, Volume 14, No.346 (Development Boundary Conditions-956) [4289] for Japanese Application JP-A-2 119427 discloses an output buffer circuit whereby further transistors for limiting the output amplitude are connected in series between the supply voltage terminals (VDD, VSS) and the respective output transistors, and the occurrence of malfunctions is avoided in this way.

The publication International Patent Application WO-A-92 009 141 discloses a differential output buffer circuit whose two branches are respectively wired with terminals of the full supply voltage (VDD, VSS), and the branches respectively comprise a series circuit of output transistors and an additional MOS limiting transistor, whereby the gates of the MOS limiting transistors are driven with a voltage generated in a bias generator that is lower than the full supply voltage.

SUMMARY OF THE INVENTION

An object underlying the invention is to provide an integrated circuit that has an optimally good relationship between the reduction of the overall dissipated power and the reduction of the performance capability and immunity to interference connected therewith. This and other object is inventively achieved by an integrated circuit arrangement having a clock driver circuit, a first terminal of at least a last stage of the clock driver circuit being supplied with a clock supply voltage that is lower in terms of amount than a general supply voltage of the integrated circuit, whereby a second terminal of the at least one last stage of the clock driver circuit is directly connected to reference potential, and whereby a load current flows between the first and second terminal. The preferred embodiments provide an integrated circuit wherein the last stage of the clock driver circuit is supplied by an external voltage source. The clock supply voltage is generated from the general supply voltage by a series controller, one terminal of the series controller being connected to the last stage of the clock driver circuit and a further terminal of the series controller being connected to the general voltage supply.

A switching transistor is provided, the first terminal thereof being connected to the general supply voltage, the second terminal thereof being connected to the general clock supply voltage and the gate terminal thereof being supplied with a clock signal inverse to the clock input signal of the last stage; and whereby the second terminal of the switching transistor is connected to reference potential via an auxiliary capacitor.

An inverter unit is provided that is supplied with the difference voltage between the output of the last stage and the general supply voltage, that is driven with a clock input signal inverse to the clock input signal of the last stage, and whose output supplies the clock supply voltage for the last driver stage, whereby the clock supply voltage simultaneously represents a clock output signal inverse to a clock output signal of the last stage. The clock supply voltage is set such that the value of the clock supply voltage amounts to 0.4 through 0.6 times the value of the general supply voltage The advantages of the preferred embodiments derive from the following comments.

BRIEF DESCRIPTION OF THE DRAWINGS

The invention is explained in greater detail below with reference to drawings. There shown are:

FIG. 3 is a circuit diagram of a third exemplary embodiment of the circuit part critical to the invention; and FIG. 4 is a circuit diagram of a last exemplary embodiment of the inventive circuit part of the low-loss integrated circuit.

DETAILED DESCRIPTION OF THE PREFERRED EMBODIMENTS

What are to be particularly understood as low-loss integrated circuits in this context are CMOS circuits. CMOS circuits with extensive pipelining are thereby particularly envisioned, since these comprise a series of registers and, thus, a more extensive clock system as a rule.

The fundamental idea is comprised in the employment of a clock generator or, respectively, a clock driver with reduced swing, i.e. that the supply voltage of the clock driver is reduced by the factor r compared to the general supply voltage. The basic structure of the clock driver comprises series-connected inverter units whose transistor widths increase toward the clock driver output. For achieving a reduced clock swing, it suffices when only the last inverter unit at the clock driver output is modified.

Figure 1:
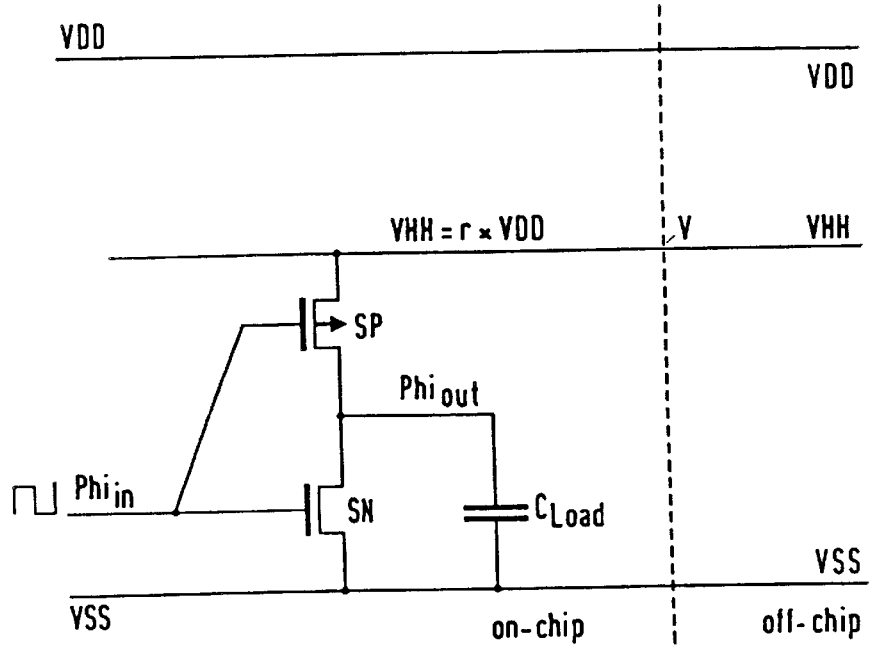
FIG. 1 is a circuit diagram of a first exemplary embodiment of a circuit part critical to the invention.

FIG. 1 shows a first exemplary embodiment of the driver unit at the clock driver output. For example, two complementary switching transistors SP and SN are thereby connected in series, whereby a first terminal of the transistor SP is connected to an externally existing, reduced clock supply voltage VHH and a first terminal of the transistor SN is connected to reference potential VSS, the second terminals of the transistors SP and SN are connected to one another and the gate terminals of the transistors SP and SN are respectively supplied with an output signal $Phi_{in}$ of a preceding inverter unit. A load capacitor $C_{Load}$ at which the clock output signal $Phi_{out}$ is adjacent lies between the connection of the two transistors SP and SN and reference potential VSS. The external clock supply voltage VHH is reduced by the factor r compared to the general supply voltage VDD.

Two external clock supply voltages are required for applications with complementary clock phases if the swing in the clock system is not supposed to be VDD/2. The maximally possible reduction of the dissipated power in the clock system thereby ensues, whereby a reduction by the factor $r^2$ occurs. However, it must also be taken into consideration that the dissipated power in the regulators of the additional, external supply voltage is added to the internal dissipated power of the chip.

Figure 2:
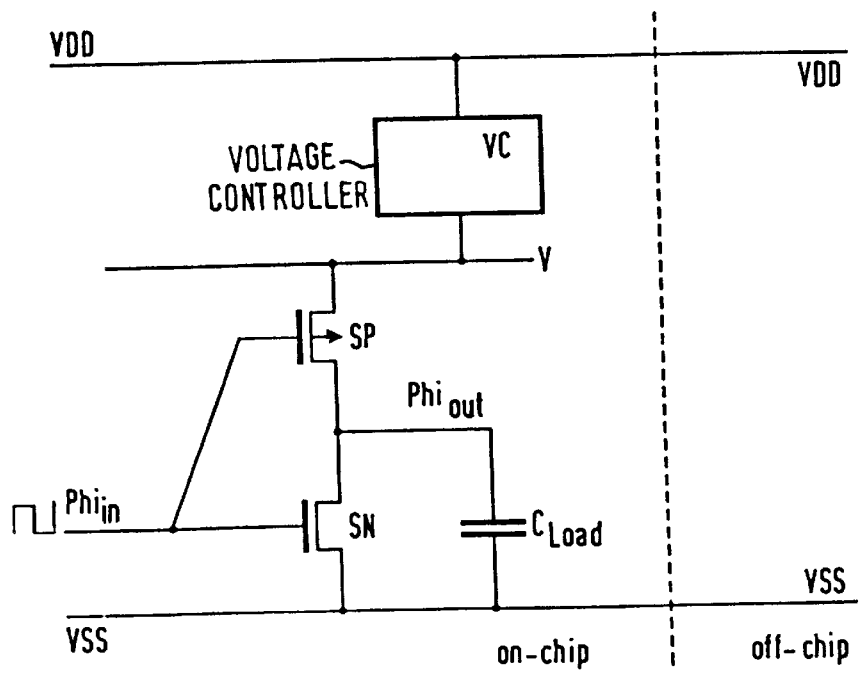
FIG. 2 is a circuit diagram of a second exemplary embodiment of the circuit part critical to the invention.

FIG. 2 shows a further example of the driver unit at the clock driver output, this differing from FIG. 1 only in that the clock supply voltage V, instead of being an external clock supply VHH, is generated with the assistance of a voltage controller VC. For example, the voltage controller VC can thereby be composed of a classic series regulator as employed, for example in stabilized power pack parts. The dissipated power in the clock driver circuit is thereby likewise reduced by the factor $r^2$; however, the additional dissipated power in the control circuit VC at which the voltage (1-r)*VDD drops off must also be taken into consideration, so that a reduction by only the factor r derives overall.

FIG. 3 shows a third exemplary embodiment of the driver unit at the output of the clock driver circuit. The controller VC shown in FIG. 2 is thereby replaced by a switching transistor SP1, whereby a first terminal of the transistor SP1 is supplied with the supply voltage VDD, a second terminal is supplied with reference potential VSS via an auxiliary capacitor $C_{Dummy}$ and the gate terminal of the transistor SP1 is supplied with a clock signal $PhiQ_{in}$ inverse to the clock input signal $Phi_{in}$. The external auxiliary capacitor $C_{Dummy}$ is charged during a first clock phase, whereby the switching transistor SP1 inhibits. In the clock phase following thereupon, the load capacitor $C_{Load}$ of the clock driver is charged from the auxiliary capacitor via the pull-up transistor SP of the inverter unit. The swing is thereby determined according to the following equation:

$$V_{High} = VDD \times C_{Dummy}/(C_{Dummy} + C_{Load}).$$

For the specific case of $C_{Dummy} = C_{Load}$, a swing of VDD/2 derives in the clock system. The dissipated power is likewise reduced only by the factor r.

As seen only from the point of view of the dissipated power reaction, the circuit therefore offers no advantage over the control circuit VC in FIG. 2.

In some cases, the external load capacitors that are required represent too high an outlay. On the other hand, it is possible to freely select the clock swing in almost arbitrarily via this capacitor in that the external wiring is merely modified. Moreover, the charging of the auxiliary capacitor via the switching transistor SP1 can ensue with a longer time constant than the edge duration required in the clock system. Concretely, this means that the switching transistor for charging the auxiliary capacitor can be dimensioned with a clearly smaller transistor width than the pull-up transistor SP of the clock driver output stage. In this way, the typical current peaks in the supply system for the voltage VDD as produced by conventional clock drivers can be reduced together with all their problematical side effects.

FIG. 4 shows a fourth and last embodiment of the driver unit at the clock driver output. The exemplary embodiment shown in FIG. 4 differs from the exemplary embodiment in FIG. 3 in that the auxiliary capacitor $C_{Dummy}$ is replaced by a further load capacitor $C_{Load}$-Q whose second terminal is connected to the general supply voltage VDD and not to reference potential VSS, and in that a switching transistor SN1 complementary to the switching transistor SP1 is provided, the first terminal thereof being connected to the line for the reduced clock supply voltage V, the second terminal thereof being connected to the junction between the two transistors SP and SN and the gate thereof being connected to the gate of the transistor SP1.

Advantageously, the clock supply voltage (V) can be simultaneously used as an output signal $PhiQ_{out}$ inverse to the output signal $Phi_{out}$ of the last stage.

The circuit embodiment of FIG. 4 likewise works according to the principle of charge division without, however, employing an additional, external capacitor. Instead, the charge is divided between the load capacitors of the two complementary clock drivers SP, SN and SP1, SN1. The circuit is employable for complementary clock systems, this being especially attractive in view of the dissipated power because simple registers can be employed. As in the exemplary embodiment of FIG. 3, the factor r is defined by the capacitance ratios. The circuit of FIG. 4, however, is customized for the specific case of r=approx. 0.5. Since no additional components are employed in this case for the reduction of the voltage but the two complementary drivers mutually assume the role of the "drop resistor" for one another, a reduction of the dissipated power by the factor $r^2$ thereby derives. Of all of the exemplary embodiments that have been considered, this is the only embodiment without additional, external supply voltages wherein the dissipated power is reduced by the factor $r^2$, i.e. by the maximum reduction factor.

The reduction factor can be fundamentally selected in the range 0<r<1. A range of about 0.4 through about 0.6 is optimum for employment in the integrated circuit since a favorable relationship between dissipated power and performance capability or, respectively, immunity to interference is thereby present.

The switching transistors Sp and SP1 can thereby be composed, for example, of p-channel field effect transistors, and the switching transistors SN, SN1 can be composed of n-channel field effect transistors but, for example, can also be realized in the form of corresponding npn and pnp transistors.

The reduction of signal swings must be basically considered in view of a potential reduction of the signal-to-noise ratio. When the swing is reduced for only a few signals within a chip, circuit parts at which these signals are adjacent become more susceptible to interference. In known circuits of this type, the full swing between VDD and VSS is therefore employed. Particularly given circuits with extensive pipelining, however, the clock system forms a certain exception since the clock nodes have a capacitance that is higher by orders of magnitude than all other signal nodes occurring on the chip. At the same time, the transistors in the output stage of the clock driver are dimensioned wider by orders of magnitude than in a normal output of a gate that drives some signal or other. The clock system therefore has an impedance that is lower by orders of magnitude than all other signals lines at the chip. The clock signal can thus also not be as easily disturbed by a parasitic input such as, for example, some other signal power. Added thereto is that signal networks that spread extremely far beyond the chip are coupled with a great number of other signals, this also specifically applying to clock networks. When it is assumed that these signals do not all simultaneously switch into one direction, the sum of all these inputs becomes extremely small on average and approaches zero in the limit value. This assumption of statistically uniform distribution is definitely justified in normally integrated circuits of this type. Given completely dynamic logic circuits with pre-charging strategies that should not be considered here, of course, this assumption no longer applies. Given standard integrated circuits of this type, thus, the coupling of signals onto the lines of the clock system is not very serious.

Given integrated circuits with registers, the switching time is generally increased due to the reduction of the signal swing. Without a redimensioning of the registers and given a reduction factor of r=0.5, the maximum switching frequency is reduced by 60% and the dissipated power in the clock network is reduced by 75%. The balance between switching frequency and savings in dissipated power does not seem especially advantageous at first sight; however, it must be taken into consideration that the maximum clock frequency of the system in many applications is not determined by the switching speed of the registers but by critical paths in logic blocks.

On the basis of a redimensioning of the registers for instances wherein a 60% reduction of the switching speed of the registers seems unacceptable if, for example, the data throughput rate were to be diminished, the switching speed of the registers can be adapted by redimensioning the transistors driven by the clock. In order to achieve the same speed with a clock swing reduced by the factor r=0.5 as in the case of swing that is not reduced, the transistor widths of the transistors driven by the clock must be raised by about the factor 2. The overall capacitance of the system is thus increased. Since, however, the wiring capacitances are clearly higher than the capacitance deriving due to the transistor gates, the overall capacitance of the clock system is only slightly changed. The saving of dissipated power in the clock system can therefore still amount to up to 70% given a redimensioning of the registers.

Although other modifications and changes may be suggested by those skilled in the art, it is the intention of the inventors to embody within the patent warranted hereon all changes and modifications as reasonably and properly come within the scope of their contribution to the art.

We claim:

1. An integrated circuit, comprising:
   a clock driver circuit having first and second terminals and a plurality of stages,
   said first terminal of at least a last stage of the clock driver circuit being supplied with a clock supply voltage that is lower in terms of amount than a general supply voltage of the integrated circuit,
   said second terminal of the at least one last stage of the clock driver circuit being directly connected to reference potential, a load current flowing between said first and second terminals,
   an inverter unit being provided that is supplied with a difference voltage between an output of the last stage and the general supply voltage, that is driven with a clock input signal inverse to the clock input signal of the last stage, and said inverter having an output supplying the clock supply voltage for the last driver stage, the clock supply voltage simultaneously representing a clock output signal inverse to a clock output signal of the last stage.

2. An integrated circuit according to claim 1, wherein the clock supply voltage is set such that a value of the clock supply voltage amounts to 0.4 through 0.6 times a value of the general supply voltage.

* * * * *